United States Patent [19]
Tomita et al.

[11] Patent Number: 5,849,078
[45] Date of Patent: Dec. 15, 1998

[54] METHOD FOR GROWING SINGLE-CRYSTALLINE SEMICONDUCTOR FILM AND APPARATUS USED THEREFOR

[75] Inventors: Munenori Tomita; Masanori Mayuzumi; Hitoshi Habuka, all of Gunma-ken, Japan

[73] Assignee: Shin-Etsu Handotai Co., Ltd., Tokyo, Japan

[21] Appl. No.: 806,163

[22] Filed: Feb. 25, 1997

[30] Foreign Application Priority Data

Feb. 29, 1996 [JP] Japan .................................. 8-071038

[51] Int. Cl.⁶ .................................................. C30B 35/00
[52] U.S. Cl. .............................. 117/102; 117/98; 117/107; 117/914
[58] Field of Search .............................. 117/102, 98, 107, 117/914

[56] References Cited

U.S. PATENT DOCUMENTS 3,231,337  1/1966  Barkemeyer .
3,641,974  2/1972  Yamada .................................... 118/48
5,096,534  3/1992  Ozias ...................................... 117/102
5,244,694  9/1993  Ozias ...................................... 118/730

Primary Examiner—R. Bruce Breneman
Assistant Examiner—Arita Alanko
Attorney, Agent, or Firm—Ronald R. Snider

[57] ABSTRACT

A method for growing a high-quality single-crystalline semiconductor film on a substrate based on vapor phase growth while rotating the substrate and preventing micro-particles generated by a rotary drive unit from adhering onto the major plane of the substrate. The substrate 2 set inside the reaction chamber 21 is rotated using the rotary drive unit 7, a reaction gas 10 is fed to the major plane side of the substrate 2, a purge gas 3a is fed to the back space of the substrate in the reaction chamber 21 to replace a space 11a with a carrier gas atmosphere, where the rotary drive unit 7 is located in the purge gas discharge section 13, a purge gas discharge duct 12 is connected to the purge gas discharge section, and further to the purge gas discharge duct 12 is connected a gas flow controller 8, and serially in the downstream side thereof is connected an evacuation pump 9.

4 Claims, 4 Drawing Sheets

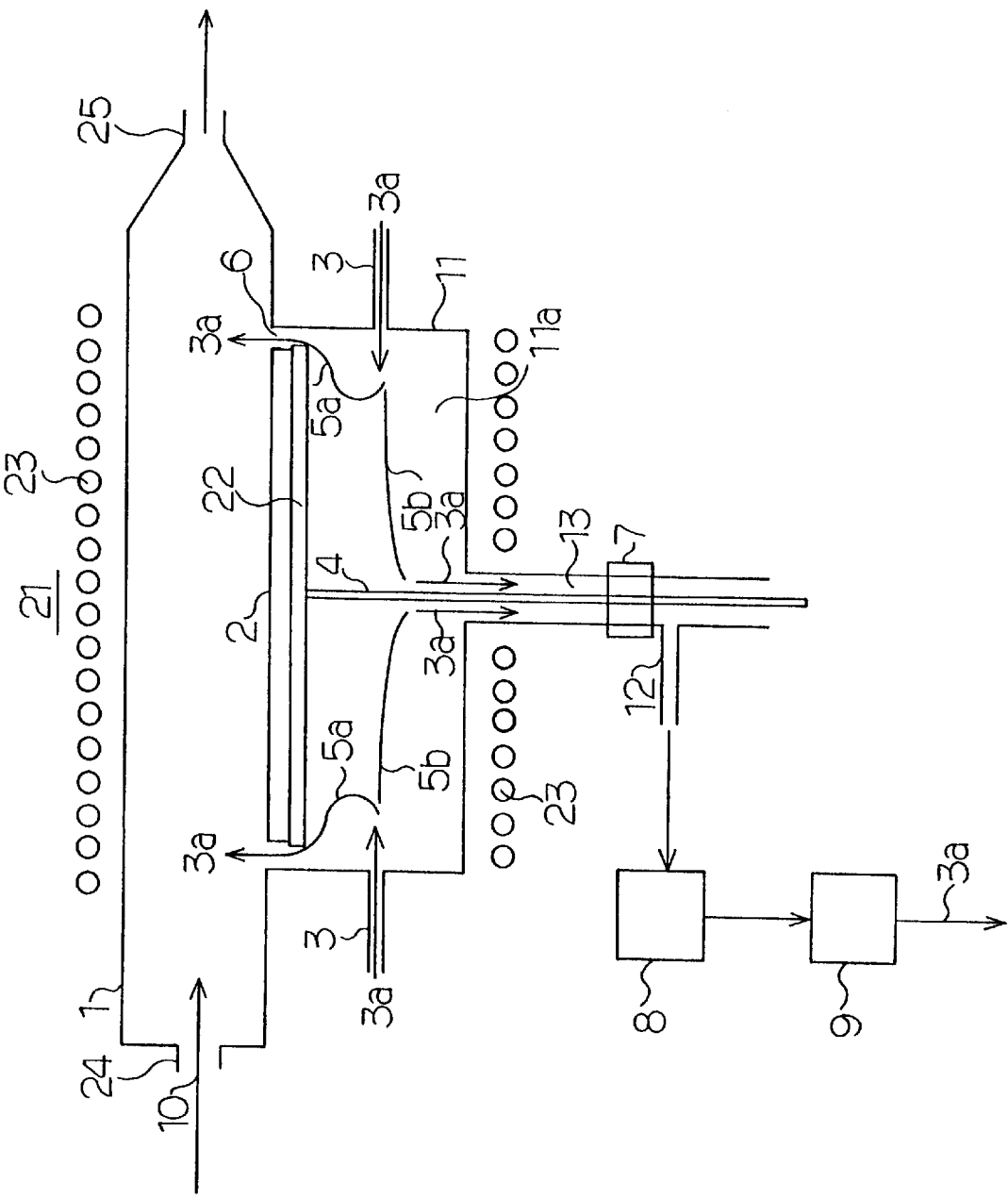

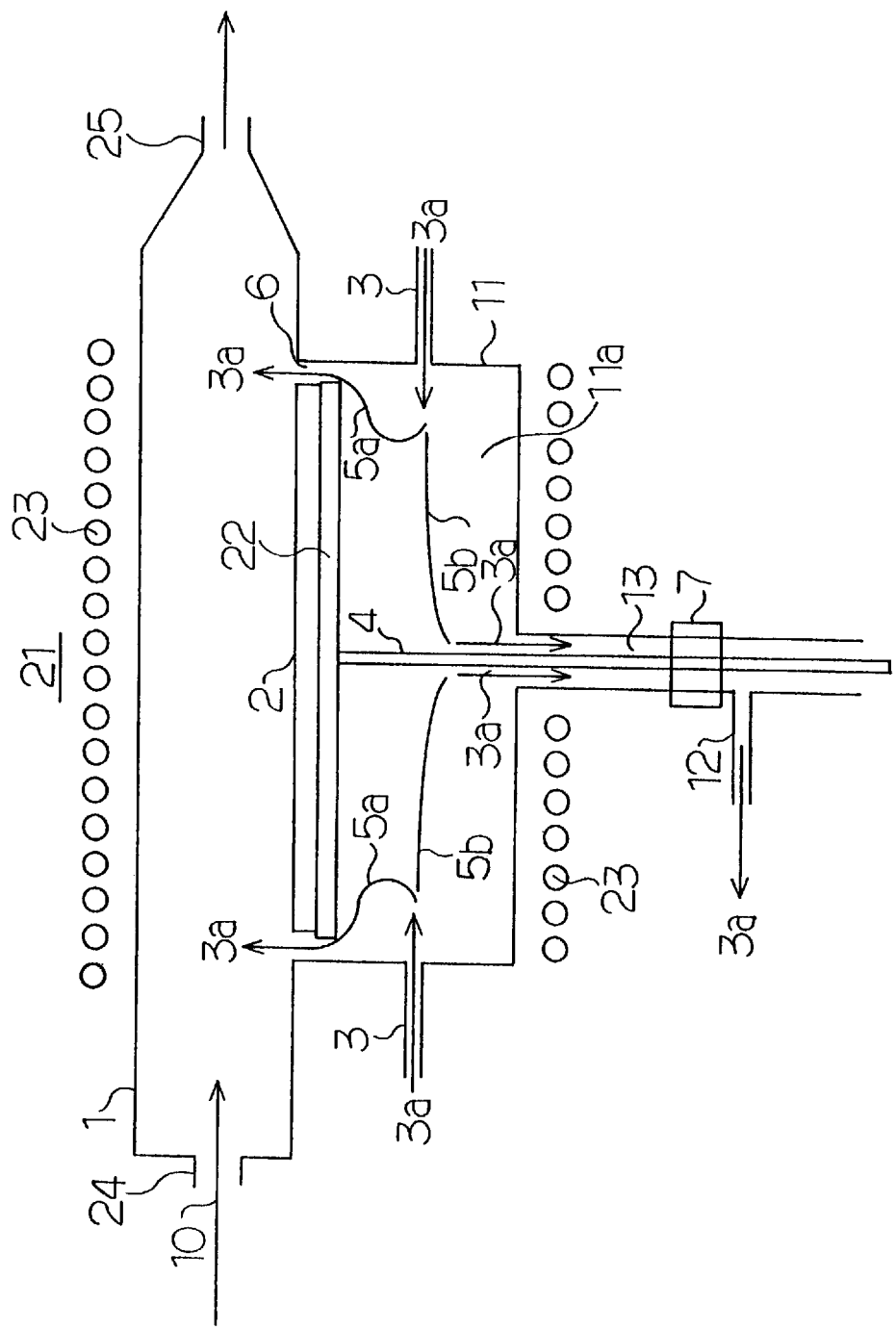

METHOD FOR GROWING SINGLE-CRYSTALLINE SEMICONDUCTOR FILM AND APPARATUS USED THEREFOR

The present disclosure relates to subject matter contained in Japanese patent application No. 71038 (Filed on Feb. 29, 1996) which is expressly incorporated herein by reference in its entirety.

BACKGROUND OF THE INVENTION

1. Field of the Invention

The present invention relates to a method and an apparatus for growing single-crystalline semiconductor film based on vapor phase growth.

2. Description of the Related Art

FIG. 4 shows one typical example known as a conventional apparatus for depositing a single-crystalline silicon film on a single-crystalline silicon substrate based on vapor phase growth. In a transparent quartz glass-made reaction chamber 21 of this apparatus, a single-crystalline silicon substrate (abbreviated on occasion as "substrate", hereinafter) is set on a susceptor 22 in parallel with a chamber wall 1. The substrate is heated by a series of infrared lamps 23 equipped as a heating unit externally along the chamber wall 1, and reaction gas 10 consisting of carrier gas and source gas is supplied from a reaction gas supply port 24 to be flown over the major plane of the substrate 2. When the substrate 2 is heated to a temperature suitable for the growth of single-crystalline semiconductor film, as high as 800° to 1200° C. for example, a single-crystalline semiconductor film can deposit on the major plane of the substrate 2 by chemical reaction of the reaction gas 10.

The vapor phase growth while the substrate 2 being held in an immobile state will result in a thicker single-crystalline semiconductor film on the upstream side along the flow direction of the reaction gas 10 and in a thinner film on the downstream side. Thus the susceptor 22 for holding the substrate 2 is directly coupled with a rotary shaft 4 to be rotated by a rotary drive unit 7, to assure an uniform thickness of the single-crystalline semiconductor film. To prevent the reaction source from admitting into a back space 11a of the substrate 2 in the reaction chamber 21, a purge gas 3a same as the carrier gas is supplied from a purge gas feed pipe 3, and flown through a purge gas feed section 14 located at the rotary drive unit 7 to completely replacing the space 11a with an atmosphere of the purge gas 3a. The purge gas 3a is thus allowed to flow as indicated by arrow 5 via a gap 6 between the periphery of the susceptor 22 and the chamber wall 1 to reach the major plane side of the substrate 2, and is then brought into confluence with the reaction gas 10 to be discharged from a reaction gas exhaust port 25.

The above apparatus has, however, been suffering from particles generated at the rotary drive unit 7 due to mechanical friction and adhere on the major plane of the substrate 2 after transported thereto together with the purge gas 3a, which could cause defects including stacking fault and abnormally grown matter in a form of protrusion on the surface of the grown film.

SUMMARY OF THE INVENTION

It is therefore an object of the present invention to provide a method and an apparatus for growing a single-crystalline semiconductor film with a high quality and without any surface defect such as stacking fault or protruding defect through preventing particles generated by a rotary drive unit from adhering onto the major plane of the substrate.

In accordance with an aspect of the present invention, the above object is attained by providing a method for growing single-crystalline semiconductor film in which a single-crystalline semiconductor substrate set in a reaction chamber is subjected to vapor phase growth while being rotated using a rotary drive unit, being supplied to the major plane thereof with a reaction gas, and also being supplied to the back space thereof in the reaction chamber with a purge gas, at least a part of the purge gas fed to the back space of the substrate being passed through the rotary drive unit and then discharged under reduced pressure out of the reaction chamber while being controlled its exhaust volume using a gas flow controller.

In accordance with another aspect of the present invention, there is provided an apparatus for growing single-crystalline semiconductor film based on vapor phase growth comprising a reaction chamber 21, a rotary drive unit 7 for rotating a single-crystalline semiconductor substrate set in the reaction chamber 21, a gas feed section for feeding reaction gas 10 to a major plane side of the substrate 2, a gas discharge section, a purge gas feed section for feeding a purge gas 3a to a substrate back space 11a in the reaction chamber 21 and a purge gas discharge section 13, in which the purge gas feed section being directly connected to the substrate back space 11a, the rotary drive section 7 being designed to allow purge gas flow therethrough as well as being located at the purge gas discharge section 13, a purge gas discharge duct 12 being connected to the purge gas discharge section 13, and to the purge gas discharge duct 12, a gas flow controller 8 and an evacuation pump 9 placed further in the downstream thereof being connected.

The reason why the above gas flow controller 8 and the evacuation pump 9 are employed is to enable at least a part of the purge gas 3a fed to the substrate back space 11a to be discharged out of the reaction chamber 21 through the gas discharge section 13 and the purge gas discharging duct 12, which assures complete discharge of particles and so forth generated at the rotary drive unit 7 without admixing them to the loading area of the substrate. As a result, a clean purge gas 3a free from the particles and so forth can be fed to the loading area of the substrate 2.

With the above apparatus, a supply volume of the purge gas to the major plane side of the substrate 2 is kept constant by controlling a feed volume of the purge gas to the substrate back space 11a at constant and by maintaining an exhaust volume of the purge gas through the purge gas discharge duct 12 with use of the gas flow controller 8, which successfully results in reducing variations in the quality of single-crystalline semiconductor film grown on the surface of the substrate.

In the case without the gas flow controller 8, particles generated at the rotary drive unit 7 or polluted gases would be whirled up to the loading area of the substrate 2 to cause contamination of the grown single-crystalline semiconductor film.

For the apparatus for growing single-crystalline semiconductor film of the present invention, the gas flow controller 8 is conveniently composed of a mass flow controller (MFC), and the evacuation pump 9 is favorably chosen as a dry pump, oil-sealed rotary pump, turbo molecular pump, oil diffusion pump or diaphragm pump, either of which preferably having an exhaust gas volume of 10 to 100 liters/min. and an ultimate pressure of 0.001 mmEg or below. This configuration can provide a pressure difference between the upstream site and downstream site of the MFC, which makes an MFC operation stable enough to assure exhaustion at a constant volume.

Inner diameters of the purge gas discharge section 13 and the purge gas discharge duct 12, in particular of the section between a flow-out end of the purge gas discharge section 13 and a flow-in end of the evacuation pump 9, are selected in a range of, for example, 1 to 10 mm.

A favorable procedures with use of the above apparatus for growing single-crystalline semiconductor film is typically described as below. That is, in the vapor phase growth, a purge gas 3a is fed to the back space 11a behind the substrate in the reaction chamber at a flow rate of 2 to 100 liters/min., and a part of which is discharged out of the reaction chamber at a flow rate of 1 to 10 liters/min. after being transported over the major plane side of the substrate. The residual portion of the purge gas is allowed to flow down in the rotary drive unit 7 and discharged out of the reaction chamber with its discharge flow rate controlled by the gas flow controller 8, under reduced pressure as lowest as 50 Torr (i.e. from 50 Torr to the ambient pressure) at the flow-out end of the gas flow controller 8. On the other hand, pressures in the reaction chamber 11 and in a purge gas discharge passage from the reaction chamber 11 to the flow-in end of the gas flow controller 8 (that is, the purge gas discharging section 13 and a part of the purge gas discharge duct 12) are maintained at the ambient pressure.

According to such operation procedures, a stable discharge with a constant flow rate is attainable since a pressure difference is generated between the upstream and downstream sides of the MFC to stabilize the operation thereof.

BRIEF DESCRIPTION OF THE DRAWINGS

The above and other objects, features and advantages of the present invention will become apparent from the following detailed description when taken with the accompanying drawings in which:

FIG. 1 shows a graphical sectional view for explaining a structure of an apparatus for growing single-crystalline semiconductor film in accordance with an embodiment of the present invention, FIG. 3 shows a graphical sectional view for explaining a structure of an apparatus for growing single-crystalline semiconductor film in accordance with a comparative example.

DESCRIPTION OF THE PREFERRED EMBODIMENTS

Figure 2A:
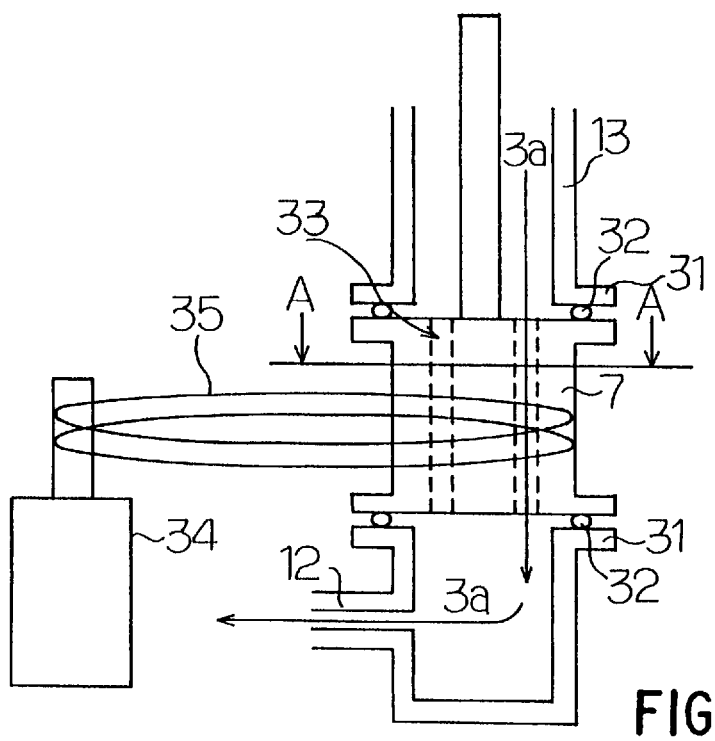
FIG. 2 shows a graphical views for explaining a typical placement of a rotary drive unit to the purge gas discharging section in the apparatus shown in FIG. 1, where chart (a) corresponds to a vertical sectional view and chart (b) to a sectional view taken on line A—A thereof.

The present invention will be detailed in connection with a preferred embodiment.

EXAMPLE 1

FIG. 1 shows a graphical sectional view for explaining a structure of an apparatus for growing single-crystalline semiconductor film. This apparatus allows a substrate 2 set on a susceptor 22 enclosed in a reaction chamber 21 to rotate using a rotary drive unit 7, a reaction gas 10 to be fed to the major plane side of the substrate 2, and a purge gas 3 same as a carrier gas to be fed to a back space 11a behind the substrate in the reaction chamber 21, thus enabling displacement of the back space 11a with an atmosphere of the carrier gas.

The apparatus is uniquely designed so that the purge gas can flow through the rotary drive unit 7 attached to a purge gas discharge section 13, that a purge gas discharge duct 12 is connected to the purge gas discharge section 13, and that a gas flow controller 8 and an evacuation pump 9 placed further in the downstream thereof are connected to the purge gas discharge duct 12.

In further details, the reaction chamber made of transparent quartz glass is horizontally aligned, the substrate 2 is set on the susceptor 22 placed in the reaction chamber 21 in parallel to a chamber wall 1 thereof (i.e. horizontally), and a reaction gas 10 composed of carrier gas and source gases is flown to the major plane side of the substrate 2 heated by infrared lamps 23. Chemical reaction by the reaction gas 10 will occur when the substrate 2 is heated to a temperature suitable for the growth of single-crystalline semiconductor film, that is 800° to 1200° C. for example, which results in the film growth on the major plane of the substrate 2.

In the growth of single-crystalline semiconductor film, uniform thickness in the grown film is accomplished by rotating the susceptor 22 supported on the upper end of the rotary shaft 4 and by rotating the rotary shaft 4 using the rotary drive unit 7. The back space 11a behind the substrate is provided by attaching a cylindrical container 11 on the bottom of the reaction chamber 21, which is accompanied by formation of an annular gap 6 between the outer periphery of the susceptor 22 and the container 11.

To ensure a complete displacement of the back space 11a with an atmosphere of the carrier gas, that is a major component of the reaction gas 10, a purge gas feed pipe 3 is attached to the sidewall of the container 11 and a purge gas 3a identical to the carrier gas is fed therethrough while a single-crystalline semiconductor film is grown on the major plane of the substrate 2. A portion of the purge gas advances a first route 5a and passes through the gap 6 to be brought into confluence with the reaction gas 10, and is then discharged out of the reaction chamber 21 via the major plane side of the substrate. The other portion takes a second route 5b, in which the gas is passed through the interior of the rotary drive unit 7 provided in the purge gas discharge section 13 as drawn by the evacuation pump 9 and is then discharged out of the reaction chamber 21 through the purge gas discharge duct 12 and the gas flow controller 8.

The purge gas 3a taking the second route 5b differs in the pressure measured at the gas flow-in end and flow-out end of the gas flow controller 8 due to an operation of the evacuation pump 9, which permits the gas flow controller 8 to forward the gas through the purge gas discharge section 13 at a constant flow rate.

As described in the above, since the apparatus for growing single-crystalline semiconductor film is designed so that the purge gas 3a flowing down through the rotary drive unit 7 provided in the purge gas discharge section 13 is regulated in its flow rate with aid of a gas flow controller, the purge gas can forcedly be discharged out of the reaction chamber 21 without yielding a counter-flow. Thus the apparatus is totally exempt from particles which are generated due to mechanical friction and so forth from the rotary drive unit 7 and transported together with the purge gas 3a from the back side of the substrate 2 toward the major plane side thereof (semiconductor film growth area), and can certainly prevent the generation of stacking fault or abnormally grown protruding defect in or on the grown single-crystalline semiconductor film which have been caused by particle adhesion thereto.

For the case that the major plane of the single-crystalline semiconductor substrate or the interior of the reaction chamber is cleaned by feeding a corrosive gas (hydrogen chloride gas, hydrogen fluoride gas or chlorine trifluoride, etc.) to the reaction chamber, it is favorable to make the whole volume of the purge gas already fed to the back space of the substrate in the reaction chamber discharge out of the chamber via the major plane side, that is to discontinue flowing a portion of the purge gas toward the rotary drive unit. Such operation will effectively prevent the rotary drive unit, reduced pressure discharge piping, evacuation pump and other equipment or members from being corroded due to the above corrosive gasses.

FIG. 2 represents an outline of a structure of the rotary drive unit 7 and a placement of thereof to the purge gas discharge section 13, where chart (a) corresponds to a vertical sectional view and chart (b) to a sectional view taken on line A—A thereof.

Figure 2B:
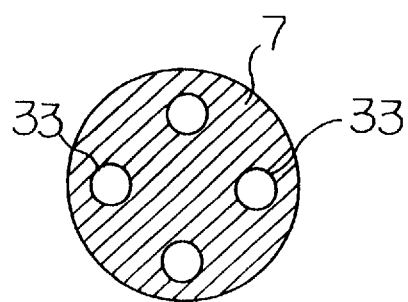

As shown in FIG. 2(a), a lower part of the purge gas discharge section 13 is fabricated into a pair of flanges 31,31 being vertically faced and properly spaced, and the rotary drive unit 7 is inserted between the flanges via ball bearings 32. At the lower end of the purge gas discharge section 13, the purge gas discharging duct 12 is connected. The rotary drive unit 7 has, as shown in FIG. 2(b), throughholes for discharging the purge gas. A belt 35 is mounted between the rotary drive unit 7 and an externally equipped motor 34. The rotary shaft 4 is connected perpendicularly onto the rotary drive unit 7.

Thus the rotary shaft 4 can rotate together with the rotary drive unit 7 driven by the motor 34. Here micro-particles generated at the ball bearing 32 are carried by downflow of the purge gas 3a, without causing contraflow, to be completely discharged out from the purge gas discharge duct 12, so that they are successfully prevented from being carried beyond the rotary shaft 4, or into the reaction environment.

A test example using the single-crystalline semiconductor film growing apparatus as shown in FIG. 1 is described hereinafter.

TEST EXAMPLE 1

To effect a vapor phase growth of a single-crystalline semiconductor film of silicon on a single-crystalline silicon substrate 2 of 200 mm diameter, hydrogen as a carrier gas at 100 liters/min and trichlorosilane as a reaction source at 22 grams/min were mixed to supply a reaction gas 10, and the substrate 2 was heated to 1150° C. using the infrared lamps 23 arrayed to form a heating section externally along the chamber wall 1 of the reaction chamber 21. The substrate 2 set on the susceptor was rotated at a rotating speed of 25 rpm. A target value for the gas flow controller 8 was set to 2 liters/min, while hydrogen gas, the same gas as the carrier, was fed at 5 liters/min from the purge gas feed pipe 3. As the evacuation pump 9, the one with a evacuation potential to allow an achievable pressure of 0.001 mmHg was employed. An absolute pressure on the downstream of the gas flow controller 8 was found to be approx. 0.5 atoms. A flow rate of the purge gas going through the gap 6 was controlled at 3 liters/min by the conditions mentioned above.

Since the above process of single-crystalline semiconductor film growth requires thorough removal of silicon oxide naturally grown on the major plane of the substrate 2 as its pretreatment, a composition of the reaction gas 10 before the thin film growth was given as 100% hydrogen while the substrate 2 being held at 1190° C. for 60 seconds.

According to the above conditions, a single-crystalline semiconductor film made of silicon was grown to a thickness of 10 μm on the substrate 2. An observation of scattered laser light on the surface of the grown film revealed only five light scattering bodies with a diameter of 0.13 μm or larger over the entire surface of the substrate other than a peripheral 10 mm-wide region.

Figure 4:
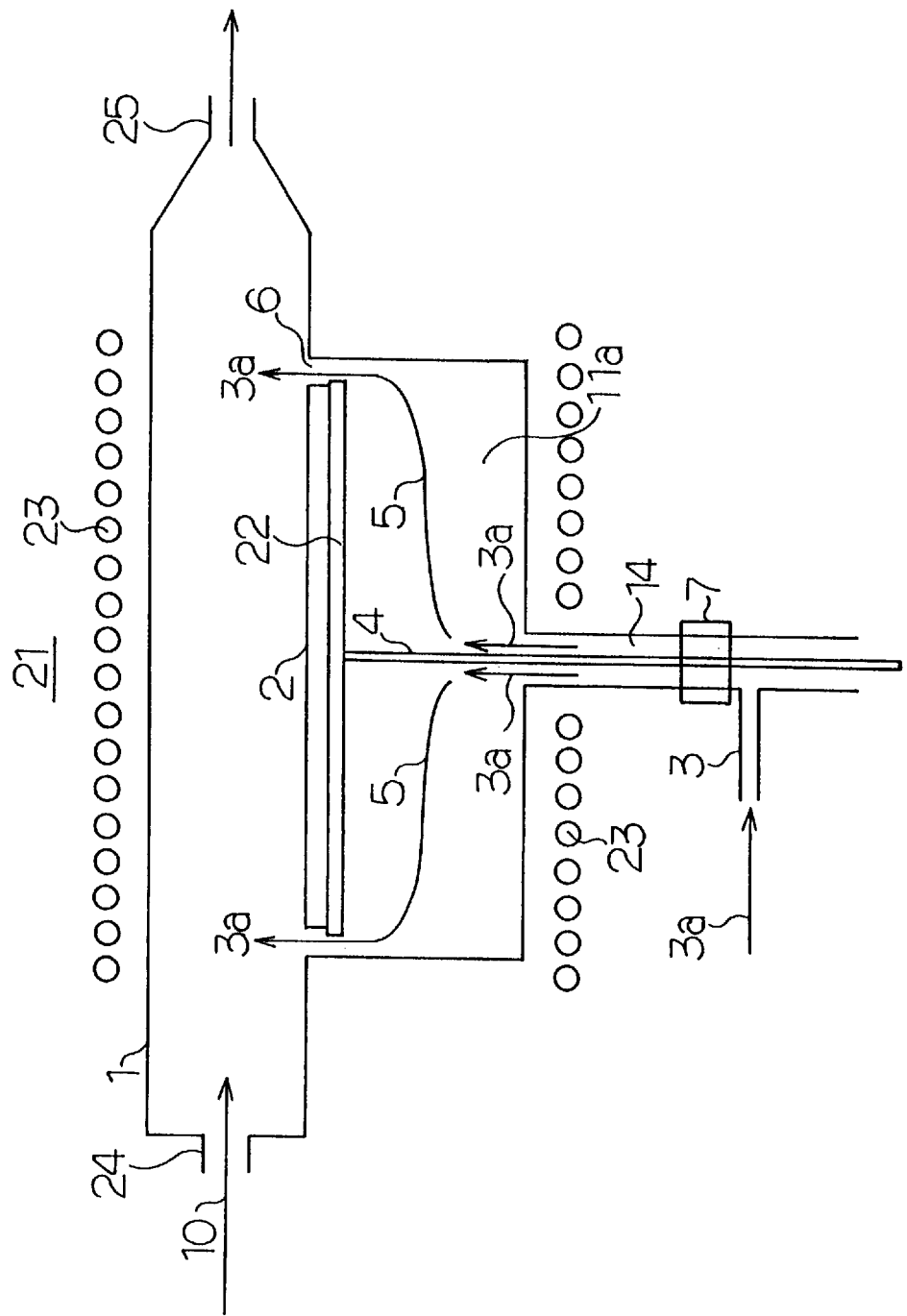
FIG. 4 shows a graphical sectional view for explaining a structure of a conventional apparatus for growing single-crystalline semiconductor film.

Next, a comparative test with use of the single-crystalline semiconductor film growing apparatus as shown in FIG. 3 and still another comparative test with use of the conventional single-crystalline semiconductor film growing apparatus as shown in FIG. 4 are described below.

COMPARATIVE TEST EXAMPLE 1

The apparatus shown in FIG. 3 is equivalent to that shown in FIG. 1 in that the rotary drive unit 7 is equipped to the purge gas discharge section 13, the purge gas discharge section 13 being connected with the purge gas discharge duct 12, to allow a part of the purge gas 3a to be discharged via the major plane of the substrate to the exterior of the reaction chamber 21, and the other part to be discharged via the purge gas discharge section 13 and the purge gas discharge duct 12, but differs in that the purge gas discharge duct 12 having neither a gas flow controller nor a evacuation pump attached thereto.

Using the apparatus as shown in FIG. 3, a single-crystalline semiconductor film made of silicon was grown to a thickness of 10 μm on a single-crystalline silicon substrate under the same conditions as described in Test Example 1 (whereas without using a gas flow controller and evacuation pump as a natural consequence). The resultant film yielded as much as 50 or more defects with a diameter of 0.13 μm or larger over the entire surface of the substrate other than a peripheral 10 mm-width region.

Investigation into the reason why such results obtained revealed that since the flow rate of the purge gas 3a was extremely low and unstable due to a small inner diameter of the purge gas discharge duct 12 in the above apparatus and more a forced discharge was not available, the micro-particles originated from the rotary drive unit 7 were, in practice, hardly swept out via the purge gas discharge duct 12 but diffused and mixed into the substrate loaded area (epitaxial growth area).

COMPARATIVE TEST EXAMPLE 2

Using the apparatus as shown in FIG. 4, a single-crystalline semiconductor film made of silicon was grown to a thickness of 10 μm on a single-crystalline silicon substrate under the same conditions as described in Test Example 1. The resultant film yielded as much as 100 or more defects with a diameter of 0.13 μm or larger over the entire surface of the substrate other than a peripheral 10 mm-width region.

As will be clear from the foregoing explanation, a growing method and growing apparatus of the present invention, which enable growth of a single-crystalline semiconductor film on a substrate rotated in a reaction chamber and replacement of an atmosphere in the back side of the substrate in the reaction chamber with a purge gas, are designed so that micro-particles originated from a rotary drive section for rotating the substrate are forcedly discharged out of the reaction chamber together with the purge gas under controlled discharge rate and reduced pressure without being routed via the substrate loading area. The micro-particles are thus prevented from being carried from the back side to the major plane side of the substrate (semiconductor film growing area), which will completely eliminate defects such as stacking faults or abnormally grown protruding defect caused by adhered microparticles, and will enable manufacture of high-quality epitaxial wafer with a good stability.

While the present invention has been described in connection with certain preferred embodiment, it is to be understood that the subject matter encompassed by the present invention is not limited to that specific embodiment. On the contrary, it is intended to include all alternatives, modifications, and equivalents as can be included within the spirit and scope of the following claims.

What is claimed is:

1. A method for growing a single-crystalline semiconductor film in which a single-crystalline semiconductor substrate set in a reaction chamber is subjected to vapor phase growth while being rotated using a rotary drive unit comprising the steps of:

feeding a back space of the substrate in the reaction chamber with a purge gas;

feeding at least a part of the purge gas fed to the back space of the substrate into a rotary drive shaft;

and discharging at least part of the purge gas out of the reaction chamber under reduced pressure with its flow rate controlled.

2. A method for growing a single-crystalline semiconductor film as set forth in claim 1, wherein a pressure of a purge gas discharge passage between said reaction chamber and a flow-in end of said gas flow controller is kept at the atmospheric pressure, while the pressure at a flow-out end of said gas flow controller is reduced up to a miximum 50 Torr.

3. A method for growing a single-crystalline semiconductor film as set forth in claim 1, wherein said purge gas fed to the back space of said substrate is kept constant in its feed volume.

4. A method for growing a single-crystalline semiconductor film as set forth in claim 1 wherein flow rate of purge gas fed into the rotary shaft is controlled by using a gas flow controller.

* * * * *

UNITED STATES PATENT AND TRADEMARK OFFICE
CERTIFICATE OF CORRRECTION

PATENT NO. : 5,849,078
DATED : December 15, 1998
INVENTOR(S) : Tomita et al Page 1 of 2

It is certified that error appears in the above-identified patent and that said Letters Patent is hereby corrected as shown below:

On the title page, under item [56], insert the following:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 5 | 3 | 2 | 4 | 5 | 4 | 0 | 06/28/94 | Terada | | | |
| | | | | | | | | | | | | | |

UNITED STATES PATENT AND TRADEMARK OFFICE
CERTIFICATE OF CORRRECTION

PATENT NO. : 5,849,078
DATED : December 15, 1998
INVENTOR(S) : Tomita et al It is certified that error appears in the above-identified patent and that said Letters Patent is hereby corrected as shown below:

On the title page, under item [56], insert the following:

FOREIGN PATENT DOCUMENTS

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | | 06 | 2 | 2 | 0 | 6 | 4 | 2 | 08/09/94 | Japan | | | | |
| | | 04 | 1 | 8 | 6 | 8 | 2 | 5 | 07/03/92 | Japan | | | | |
| | | | | | | | | | | | | | | |

Signed and Sealed this

Sixth Day of April, 1999

Attest:

*Attesting Officer*

Q. TODD DICKINSON

*Acting Commissioner of Patents and Trademarks*